(12) United States Patent
Seo

(10) Patent No.: US 6,840,249 B2
(45) Date of Patent: Jan. 11, 2005

(54) METHOD FOR CLEANING A SEMICONDUCTOR DEVICE

(75) Inventor: Bo Min Seo, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 69 days.

(21) Appl. No.: 10/328,028

(22) Filed: Dec. 26, 2002

(65) Prior Publication Data

US 2003/0121527 A1 Jul. 3, 2003

(30) Foreign Application Priority Data

Dec. 27, 2001  (KR) ................................ 10-2001-0086378

(51) Int. Cl.⁷ ................................................ B08B 7/00
(52) U.S. Cl. ................. 134/1.2; 134/2; 134/3; 134/19; 134/31; 216/17; 216/39; 216/63; 216/67; 216/75; 216/77; 216/78; 438/906
(58) Field of Search ........................... 134/1.2, 2, 3, 19, 134/31; 216/17, 39, 63, 67, 75, 77, 78, 58; 438/906

(56) References Cited

U.S. PATENT DOCUMENTS 4,923,828 A * 5/1990 Gluck et al. .................. 134/1.2
5,865,900 A * 2/1999 Lee et al. ..................... 134/1.2

OTHER PUBLICATIONS

Condenced Chemical Dictionary by Van Nostrand Reinhold, 1993. pp. 540, 990.*

* cited by examiner

Primary Examiner—M. Kornakov
(74) Attorney, Agent, or Firm—Piper Rudnick LLP

(57) ABSTRACT

In order to clean a semiconductor device having a dielectric layer deposited on a top surface of a lower metal wiring of the semiconductor device, and a contact hole or a via hole formed in the dielectric layer to expose the lower metal line therethrough, the semiconductor device is located within a radio frequency (RF) cleaning chamber. A gas mixture of HCl and $H_2O$ is introduced into the RF cleaning chamber and Ar gas plasma is generated in the RF cleaning chamber to excite HCl gas so that the HCl gas and an excited HCl gas are used to remove carbon radicals and metal particles.

10 Claims, 1 Drawing Sheet

METHOD FOR CLEANING A SEMICONDUCTOR DEVICE

FIELD OF THE INVENTION

The present invention relates to a method for cleaning a semiconductor device; and, more particularly, to a method for cleaning a semiconductor device by introducing HCl gas into a radio frequency (RF) cleaning chamber after an etching process of a contact hole or a via hole of a semiconductor device with a multi-layer wiring structure so that a polymer including carbon or a metal particle in the semiconductor device may be removed without changing a profile of the contact hole or the via hole, thereby, to result in a secure metal wiring and an improved contact resistance of the metal wiring.

BACKGROUND OF THE INVENTION

As a highly integrated semiconductor device requires a multi-layer metal wiring structure therein, a multi-layer metal wiring process having an etching process of the contact hole and the via hole, an anti-diffusion layer deposition process, a tungsten plug formation process, a chemical mechanical polishing process, a metal wiring deposition process and so on has been widely used.

After the etching process to form the contact hole and the via hole in such a metal wiring deposition process, formation of an oxide metal film layer, while the lower metal layer of the hole is exposed to the atmosphere, may yield higher resistance of the semiconductor. Further, the metal particle or the polymer including carbon may remain within the hole, and may occasionally block the hole.

In order to minimize an RC time constant delay time, a fluorinated silicate glass having a lower dielectric constant has been recently used instead of a conventional undoped silicate glass (USG) or tetra ethyl ortho silicate (TEOS) insulating film. However, such a fluorine component permeates into the anti-diffusion layer or an upper metal wiring layer, and may result in a cubical expansion, thus a detachment phenomenon of the metal wiring may occur.

Currently, an RF cleaning process has generally been used in order to solve the above problem.

However, such cleaning process also has an adverse effect in that the profile of the hole gets damaged during the RF cleaning process so that a bridge phenomenon in the contact hole or the via hole may occur. Further, the hole size miniaturizes so that the contact hole or the via hole may not completely be cleaned.

SUMMARY OF THE INVENTION

It is, therefore, a primary object of the present invention to provide a method for cleaning a semiconductor device by introducing HCl gas into a radio frequency (RF) cleaning chamber after an etching process of a contact hole or a via hole of a semiconductor device with a multi-layer wiring structure so that a polymer including carbon or a metal particle in the semiconductor device may be removed without changing a profile of the contact hole or the via hole, thereby, to result in a secure metal wiring and an improved contact resistance of the metal wiring.

In accordance with a preferred embodiment of the present invention, there is provided a method for cleaning a semiconductor device, the method comprising the steps of:

(a) forming a dielectric layer on a top surface of a lower metal wiring of the semiconductor device, wherein a contact hole or a via hole to expose the lower metal line therethrough is formed in the dielectric layer through the use of a photoresist layer;

(b) locating the semiconductor device within a radio frequency (RF) cleaning chamber;

(c) supplying a gas mixture of HCl and $H_2O$ into the HF cleaning chamber; and (d) generating Ar gas plasma in the RF cleaning chamber to excite the HCl gas so that $Cl^-$ and $H_3O^+$ are generated, said $Cl^-$ being used to remove a polymer including carbon that remains in the contact hole or the via hole.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

Figure 1:
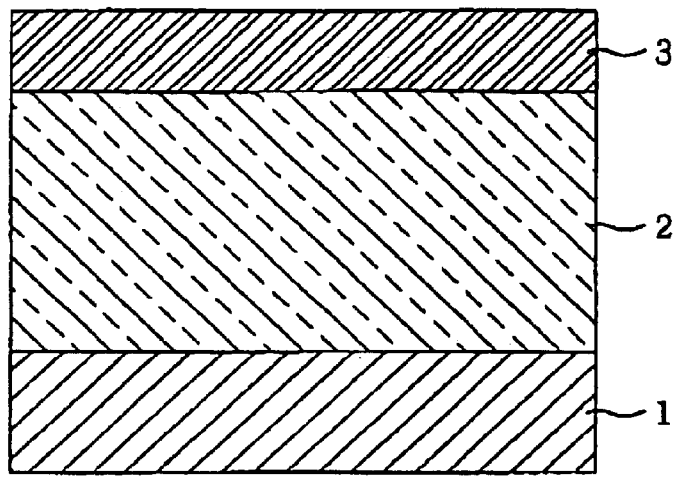
FIG. 1 represents a cross-sectional view of a conventional metal wiring in a semiconductor device.
Figure 2:
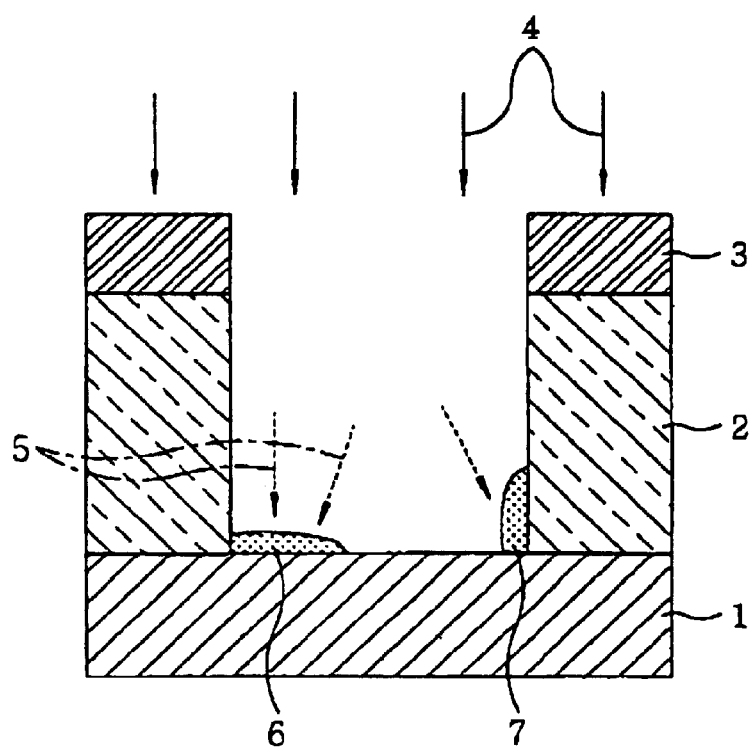
FIG. 2 shows a cross-sectional view for illustrating a cleaning process of a semiconductor device in accordance with the present invention.

Referring to FIG. 1, there is shown a cross-sectional view of a conventional metal wiring in a semiconductor device and, referring to FIG. 2, there is shown a cross-sectional view for illustrating a cleaning process of the semiconductor device in accordance with the present invention.

A dielectric layer 2 (for example, FSG or TEOS) is deposited on a top surface of a lower metal wiring of the semiconductor device, and a contact hole or a via hole is formed in the dielectric layer to expose the lower metal wiring therethrough. The lower metal wiring 1 may be connected through the contact hole or the via hole to an upper metal wiring (not shown). Also a plurality of polymers including carbon or metal particles may exist in the contact hole or the via hole of the semiconductor device as illustrated in the prior art.

In order to remove the polymers including carbon or the metal particles, the semiconductor device is located within a radio frequency (RF) cleaning chamber. Then, a gas mixture of HCl and $H_2O$ is introduced into the RF cleaning chamber. Ar gas plasma is generated in the RF cleaning chamber which helps the reaction of the HCl gas and $H_2O$ so that $Cl^-$ and $H_3O^+$ are generated. HCl gas and $Cl^-$ are used to remove a metal particle and a polymer including carbon, respectively.

The flow rate of the Ar gas is preferably about 3 to about 30 standard cubic centimeter per mm (sccm) and an HCl flow rate of the HCl gas is preferably about 10 to about 70 sccm. A power range of the RF cleaning chamber is from about 200 to about 600 W after Ar gas plasma is generated. However, the power range of the RF cleaning chamber decreases over time to a second power range of about 50 to about 300 W. It is preferable that the power to form plasma be maintained relatively low. It is also preferable that the temperature of the RF cleaning chamber be maintained at a range of about 100° C. to about 300° C.

The low power plasma allows a profile of the hole to be unchanged. The HCl gas may be used to remove the metal particles in the hole. The $Cl^-$, which is excited within the plasma, is combined with the polymer including carbon that remains in the contact hole or the via hole after formation thereof, i.e., a remainder of photoresist, to generate $CCl_4$.

HCl(g)+H$_2$O(g)->Cl$^-$+H$_3$O$^+$ (excited in the plasma)

Cl$^-$+(CH$_2$CH)$_n$->CCl$_4$(g)+H$_2$(g) (remove the polymer including carbon)

In FIGS. 1 and 2, reference numeral 3 represents a photoresist layer, 4 shows an Ar plasma etching state, 5 is an HCl gas state and 6 and 7 are a polymer including carbon or metal particle.

In accordance with the present invention, after an etching process of the contact hole or the via hole, the HCl gas cleaning may be used with the RF cleaning so that a lower power plasma may be generated to minimize a bridge phenomenon. Further, the HCl gas introduced with the plasma etching process may be used to remove the remaining polymer including carbon and metal particle in the hole. Still further, the metal wiring formation process is stabilized so that an operational reliability of the semiconductor device may be improved.

While the invention has been shown and described with respect to the preferred embodiments, it will be understood by those skilled in the art that various changes and modifications may be made without departing from the spirit and scope of the invention as defined in the following claims.

What is claimed is:

1. A method for cleaning a semiconductor device, the method comprising the steps of:
   (a) forming a dielectric layer on a top surface of a lower metal wiring of the semiconductor device, wherein a contact hole or a via hole to expose the lower metal line therethrough is formed in the dielectric layer through use of a photoresist layer;
   (b) locating the semiconductor device within a radio frequency (RF) cleaning chamber;
   (c) supplying Ar gas and a gas mixture of HCl and H$_2$O into the RF cleaning chamber; and
   (d) generating Ar gas plasma in the RF cleaning chamber to facilitate reaction of the HCl gas and H$_2$O so that Cl$^-$ and H$_3$O$^+$ are generated, the Cl$^-$ being used to remove a polymer including carbon that remains in the contact hole or the via hole.

2. The method of claim 1, wherein an Ar flow rate of the Ar gas is about 3 to about 30 standard cubic centimeter per mm (sccm) and an HCl flow rate of the HCl gas is about 10 to about 70 sccm.

3. The method of claim 1, wherein a power range of the RF cleaning chamber is from about 200 to 600 W after the Ar gas plasma is generated.

4. The method of claim 1, wherein a temperature of the RF cleaning chamber is maintained at a range of about 100° C. to about 300° C.

5. The method of claim 1, wherein a power range of the RF cleaning chamber is from about 50 W to about 300 W.

6. A method for cleaning a semiconductor device, the method comprising the steps of:
   (a) forming a dielectric layer on a top surface of a lower metal wiring of the semiconductor device, with a contact hole or a via hole to expose the lower metal line therethrough being formed in the dielectric layer;
   (b) locating the semiconductor device within a radio frequency (RF) cleaning chamber;
   (c) supplying Ar gas and a gas mixture of HCl and H$_2$O into the RF cleaning chamber; and
   (d) generating Ar gas plasma in the RF cleaning chamber to facilitate reaction of the HCl gas and H$_2$O for removal of a carbon or metal residue that remains in the contact hole or the via hole.

7. The method of claim 6, wherein a flow rate of the Ar gas is about 3 to about 30 standard cubic centimeter per min (sccm) and an HCl flow rate of the HCl gas is about 10 to about 70 sccm.

8. The method of claim 6, wherein a power range of the RF cleaning chamber is from about 200 to 600 W after the Ar gas plasma is generated.

9. The method of claim 6 wherein a power range of the RF cleaning chamber is from about 50 W to about 300 W.

10. The method of claim 6, wherein a temperature of the RF cleaning chamber is maintained at a range of about 100° C. to about 300° C.

* * * * *